US010364142B2

United States Patent
Morisue et al.

(10) Patent No.: US 10,364,142 B2
(45) Date of Patent: Jul. 30, 2019

(54) METHOD OF FORMING SPACE FOR USE IN ANALYSIS DEVICES

(71) Applicant: CANON KABUSHIKI KAISHA, Tokyo (JP)

(72) Inventors: Masafumi Morisue, Tokyo (JP); Tamaki Sato, Kawasaki (JP); Akihiko Okano, Fujisawa (JP); Tetsushi Ishikawa, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 50 days.

(21) Appl. No.: 15/661,918

(22) Filed: Jul. 27, 2017

(65) Prior Publication Data

US 2018/0037455 A1 Feb. 8, 2018

(30) Foreign Application Priority Data

Aug. 3, 2016 (JP) .................. 2016-153041

(51) Int. Cl.
*B81C 1/00* (2006.01)
*B01L 3/00* (2006.01)

(52) U.S. Cl.
CPC ........ *B81C 1/00047* (2013.01); *B81C 1/0038* (2013.01); *B01L 3/502707* (2013.01); *B81B 2201/0214* (2013.01); *B81B 2201/052* (2013.01); *B81B 2201/058* (2013.01); *B81B 2203/0315* (2013.01); *B81C 1/00484* (2013.01); *B81C 2201/0195* (2013.01)

(58) Field of Classification Search
CPC ........................ B81C 1/00047; B81C 1/0038
See application file for complete search history.

(56) References Cited

U.S. PATENT DOCUMENTS

| 7,166,180 | B2 * | 1/2007 | Nakamura | ............. B32B 37/26 156/220 |
| 7,661,190 | B2 * | 2/2010 | Wakisaka | ............. H05K 3/4661 174/258 |
| 2003/0168158 | A1 * | 9/2003 | Kato | .................. B32B 37/0007 156/247 |
| 2015/0151544 | A1 * | 6/2015 | Asai | ..................... B41J 2/14145 156/247 |
| 2016/0311222 | A1 * | 10/2016 | Sasaki | ................... B41J 2/1631 |
| 2017/0297336 | A1 * | 10/2017 | Yamamuro | ........... B41J 2/1607 |

FOREIGN PATENT DOCUMENTS

| JP | 2006-224598 A | 8/2006 |
| JP | 2008-963 A | 1/2008 |

* cited by examiner

*Primary Examiner* — Jamie C Niesz
(74) *Attorney, Agent, or Firm* — Canon U.S.A., Inc. IP Division

(57) ABSTRACT

A method of forming a space includes a step of tenting, on a substrate having a recessed portion, a dry film including a dry film material that is to be a top plate on the recessed portion. The step of tenting the dry film includes a press period and a release period and performs a press-release cycle of the press period and the release period a plurality of times, a pressed state in which the dry film is pressed against the substrate by using a pressing member is maintained during the press period, and a released state in which the pressed state is released is maintained during the release period.

8 Claims, 10 Drawing Sheets

METHOD OF FORMING SPACE FOR USE IN ANALYSIS DEVICES

BACKGROUND

Field of the Disclosure

The present disclosure relates to a method of forming a space in a manner in which a dry film including a dry film material, which is to be a top plate on a recessed portion, is laid on a substrate having the recessed portion.

Description of the Related Art

In recent years, attention has been paid to techniques for forming members having spaces to use the members as products in industrial fields. For example, there are developed techniques for analyzing various liquids or gases ranging from blood to DNA by using a single chip or device, such as a biochemical analysis device (μ-TAS), in a manner in which a space is formed in the chip and used as a channel, a reaction chamber, or a mixing chamber. There are also developed techniques for manufacturing, for example, a liquid-discharging apparatus that quantitatively and continuously discharges a filled liquid, such as an ink, in a manner in which many spaces are formed in a substrate including a discharge-energy-generating element and the substrate is used.

There is a proposed method of forming such spaces in a manner in which a dry film is laid on a substrate having recessed portions such that the dry film serves as a top plate on the recessed portions to form the spaces. Japanese Patent Laid-Open No. 2008-963 discloses a method of forming a space with a stable shape in a manner in which a film is laid while a pressure per unit area of a contact portion between the film and a substrate having a recessed portion is kept constant. Japanese Patent Laid-Open No. 2006-224598 discloses a method of manufacturing a liquid-discharging head easily in a manner in which a dry film is laid on a substrate having an ink supply port.

SUMMARY

The present disclosure provides a method of forming a space including a step of tenting, on a substrate having a recessed portion, a dry film including a dry film material that is to be a top plate on the recessed portion. The step of tenting the dry film includes a press period and a release period and performs a press-release cycle of the press period and the release period a plurality of times, a pressed state in which the dry film is pressed against the substrate by using a pressing member is maintained during the press period, and a released state in which the pressed state is released is maintained during the release period.

Further features of the present disclosure will become apparent from the following description of exemplary embodiments with reference to the attached drawings.

DESCRIPTION OF THE EMBODIMENTS

Figure 1:
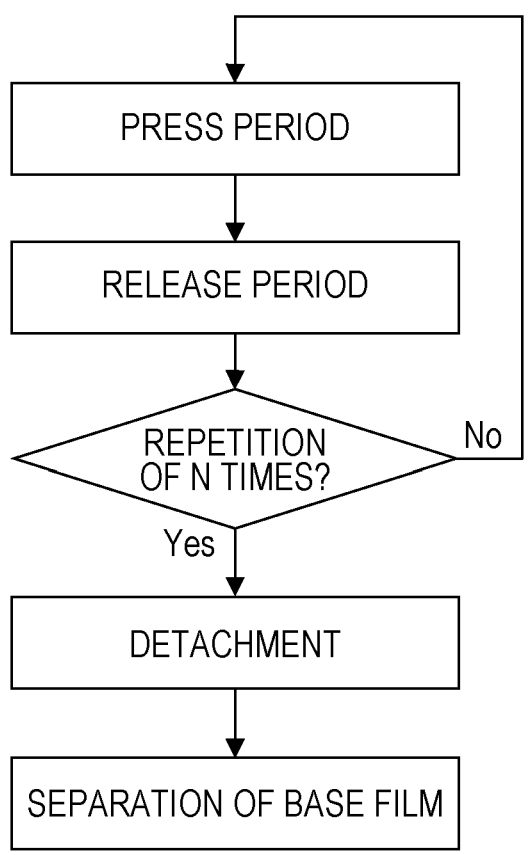
FIG. 1 is a process flow chart according to an embodiment of the present disclosure.

There is an advantage in a method of forming a space in a manner in which a dry film is laid (tented) so as to be a top plate on a recessed portion, because the space can be easily formed by a small number of processes. The method, however, has the following problem. The process of laying the dry film typically uses a method of pressing a substrate while moving and rotating an elastic member having a roll shape in contact with the substrate. In some cases where the recessed portion has an increased width, during the process, the dry film bends and deforms such that a surface thereof is depressed. Depending on press conditions, the dry film material itself flows into the space, and the thickness of the top plate partially increases. This means that the volume of the space changes and is undesirable from the viewpoint of control of the shape of the space.

An effective way to solve the above problem is to set the press conditions such that the pressure is decreased, the duration is decreased, and the temperature is decreased. In this case, however, sufficient adhesion between the substrate and the dry film material cannot be ensured, which makes a problem in that, when a base film is separated from the substrate, the dry film material itself is separated from the substrate, and a cohesive failure occurs.

The present disclosure provides a method of forming a space that enables the shape of the dry film, as the top plate, to be stably maintained and enables adhesion between the substrate and the dry film material to be ensured.

A method of forming a space according to the present disclosure includes a step of tenting, on a substrate having a recessed portion, a dry film including a dry film material that is to be a top plate on the recessed portion. The step of tenting the dry film includes a press period and a release period and performs a press-release cycle of the press period and the release period a plurality of times, a pressed state in which the dry film is pressed against the substrate by using a pressing member is maintained during the press period, and a released state in which the pressed state is released is maintained during the release period. Representative embodiments of the present disclosure will hereinafter be described with reference to the drawings.

FIGS. 2A to 2F are schematic sectional diagrams of a process flow according to an embodiment of the present disclosure. A substrate 1 having recessed portions 2 is first prepared. An example of the substrate 1 is a silicon substrate formed of silicon single crystal. A dry film 5 including a dry film material 4 formed on a base film 3 is prepared. Subsequently, the dry film. 5 is interposed between the substrate 1 and a pressing member 6 so as to be in contact with neither the substrate 1 nor the pressing member 6 and is placed in a pressing apparatus (see FIG. 2A).

Figure 2A:
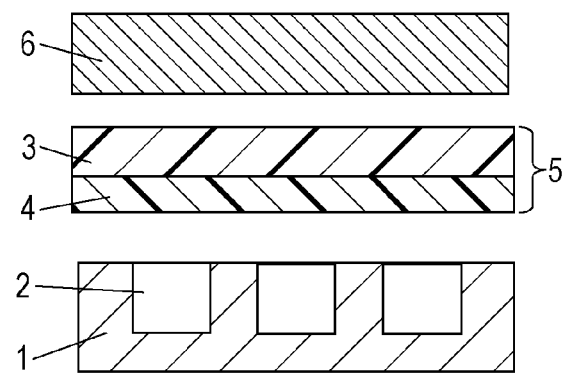
FIGS. 2A to 2F are schematic sectional diagrams of a process flow according to an embodiment of the present disclosure.
Figure 2D:
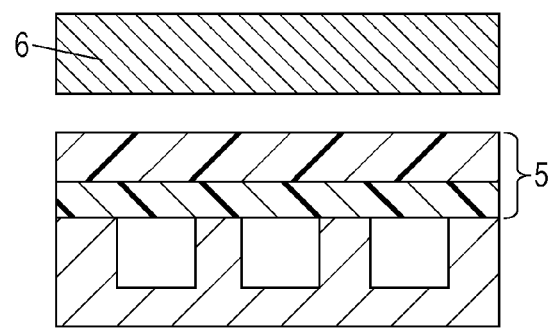
Figure 2B:
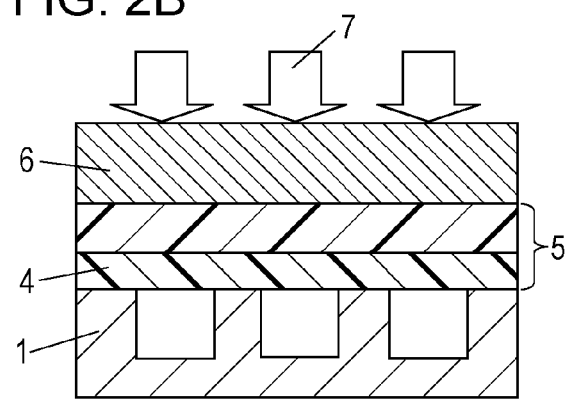

FIG. 2A illustrates recessed portions 2 that are each formed in a groove shape on a first surface (front surface) of the substrate. Each recessed portion, however, is not limited to the shape, provided that the recessed portion becomes the space in a subsequent process. For example, the recessed portion may extend from the first surface of the substrate 1 to a second surface facing the first surface. The recessed portion may be formed in a manner in which part of the substrate is removed by, for example, etching, or may be formed in a manner in which another material is stacked on the substrate. That is, according to the present disclosure, the substrate 1 having recessed portions 2 is not particularly limited in terms of a method of manufacturing the substrate 1 and the material of the substrate 1. Only a recessed portion may be formed on the substrate, or plural recessed portions may be formed on the substrate.

The dry film 5 includes the base film 3 and the dry film material 4. The base film 3 used in the dry film 5 can be appropriately selected from, for example, a PET (polyethylene terephthalate) film, a. PEN (polyethylene naphthalate) film, a PT (polyimide) film, a COC (cyclic olefin copolymer) film, and a COP (cyclic olefin polymer) film. At this time, the selection can be made in consideration of, for example, applicability when the dry film material 4 is applied, and separability of the base film 3 after laminating. Naturally, a surface treatment, for example, may be performed on the base film 3. A typical positive resist material or a typical negative resist material may be selected to be used as the dry film material 4 in accordance with the use.

A typical laminating apparatus including a pressing member having a roll shape or a pressing machine including a pressing member having a flat shape may be appropriately selected to be used as the pressing apparatus. According to the embodiment, an example of using the pressing member having a flat shape is described. An advantage of the pressing member having a flat shape is that cycle time improves in the case where a sample area increases. In addition, another advantage is that, since the pressing member presses a surface of the dry film with the surface kept flat, the problem of the surface of the dry film being depressed is solved.

Subsequently, the dry film including the dry film material, which is to be the top plate on the recessed portions, is tented. Specifically, the surface of the dry film 5 on the side on which the dry film material 4 is formed is caused to press against the first surface of the substrate 1 with a predetermined pressing force 7 by using the pressing member 6. Subsequently, a pressed state is maintained for a predetermined duration (press period) to bond the dry film material 4 to the first surface of the substrate 1 (see FIG. 2B). Subsequently, the pressing force 7 is released, and this state is maintained for a predetermined duration (release period, see FIG. 2C). Subsequently, a press-release cycle of the press period and the release period is repeated a plurality of times (see FIGS. 2B and 2C). The plurality of times corresponds to 2 times or more and can range, for example, from 2 times to 10 times. During the press-release cycle, press and release may be appropriately performed in temperature conditions that are suitable for the characteristics of the dry film material. The press-release cycle may be performed in desired temperature conditions by using, for example, a pressing apparatus including a pressing member having a temperature adjustment function.

Figure 2E:
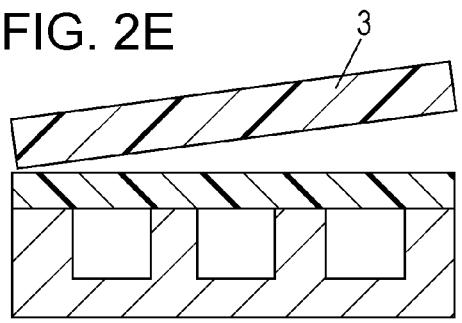
Figure 2C:
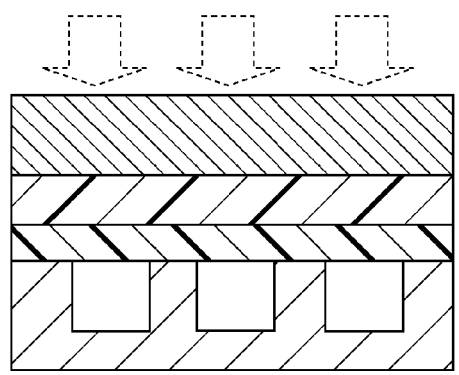
Figure 2F:
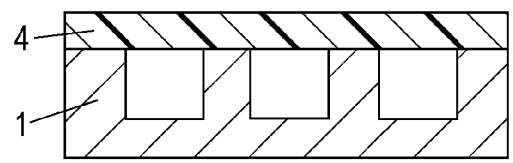

Subsequently, the pressing member 6 is detached from the dry film. 5 (see FIG. 2D), and the base film 3 is subsequently separated (see FIG. 2E). Consequently, the dry film material 4 is laid on the first surface of the substrate 1 (see FIG. 2F). Through the above procedures, spaces are formed with the top plate formed of the dry film material 4.

Figure 3:
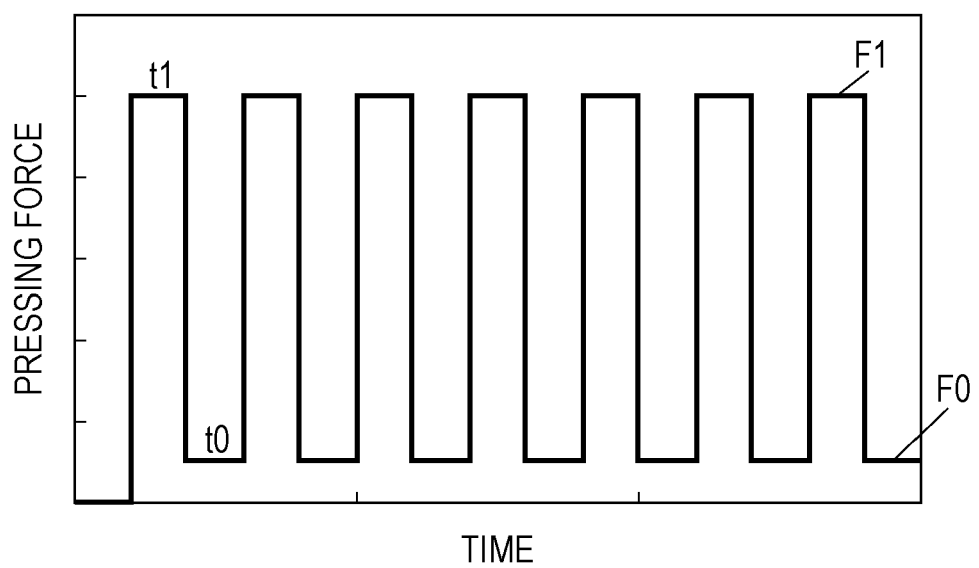
FIG. 3 is a graph illustrating the relationship between a pressing force and time according to an embodiment of the present disclosure.

FIG. 1 simply illustrates the above process flow according to the present disclosure. The present disclosure is characterized in that the press period and the release period are repeated a plurality of times (N times) and the pressing member is subsequently detached. FIG. 3 is a graph schematically illustrating the relationship between the pressing force and time in each press period and each release period. During the press period, the pressed state is maintained for a duration t1 (press duration) while a pressing force F1 is applied. During the release period, the released state is maintained for a duration t0 (release duration) while a pressing force F0 is applied so as to satisfy the relationship of F0<F1. F0 is preferably determined to be a value close to 0. Specifically, F0 can be determined to be, for example, 1013 hPa or less (atmospheric pressure or less). F1 can be determined to be, for example, 1013 hPa to 5 MPa.

FIG. 3 illustrates an example of a condition of t1=t0, but the present disclosure is not limited thereto. It is important for the present disclosure to maintain the pressed state and the released state for a certain duration. The values of t1 (press duration) and t0 (release duration) may be appropriately determined in accordance with the characteristics of the dry film material and are not limited. For example, t1 may be 1 second to 10 seconds. For example, t0 may be 1 second to 100 seconds. In FIG. 3, the pressing force and the time are determined to be constant in each press period and each release period, but are not limited thereto. For example, the pressing force F1 and the press duration t1 in each press period may be determined to vary stepwise.

The press conditions (the pressing force, the press duration, and the release duration) in the press-release cycle may be appropriately determined in accordance with the characteristics of the dry film material 4. The following description includes the press conditions that can be determined in consideration of the physical properties of the dry film material.

Figure 4A:
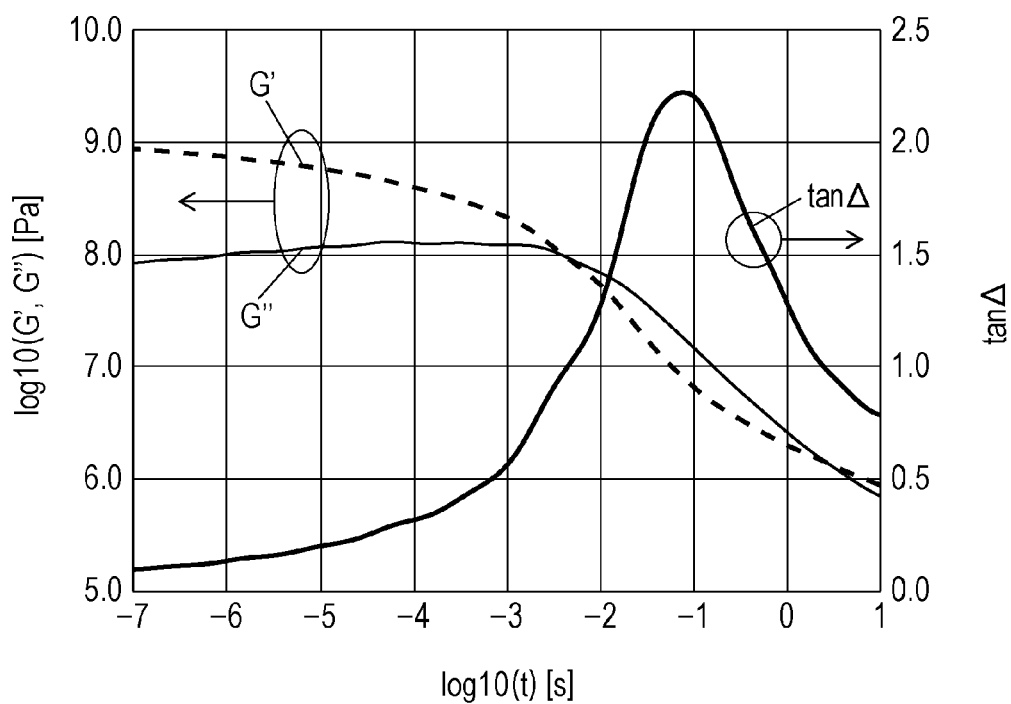
FIGS. 4A and 4B are graphs illustrating an embodiment of the present disclosure.

It has been known that the dry film material 4, which is formed of an organic material, typically exhibits viscoelasticity properties. The viscoelasticity properties of the material can be evaluated in a manner in which the values of the physical properties obtained by dynamic viscoelasticity measurement are expressed in a form called a master curve. The master curve is a composite curve produced in a manner in which a loss tangent tan Δ, which is calculated from a shear storage modulus G' and a shear loss modulus G'' that are measured in certain conditions and a ratio thereof (G''/G'), is composed with respect to a specific reference temperature, and the frequency is plotted on the horizontal axis (logarithmic axis). The master curve can be produced by a typical method. For example, FIG. 4A illustrates a master curve of a positive resist (trade name is ODUR-1010A made by TOKYO OHKA KOGYO CO., LTD.) at 90° C. In FIG. 4A, not the frequency but the period is plotted on the horizontal axis. The frequency and the period, however, have reciprocal relationships and are equivalent. The term "period" described herein corresponds to a duration (referred to below as a "press-release cycle duration") of a press-release cycle that is expressed by the sum of the press duration t1 and the release duration t0. The master curve is typically produced in conditions t1=t0. The master curve illustrated in FIG. 4A is also produced in conditions of t1=t0. However, in the case where t1 and t0 are determined to be different values, dynamic viscoelasticity measurement may be performed in a cycle while a predetermined duty ratio between t1 and t0 is maintained.

The viscoelasticity properties of a material at a certain temperature typically depend on the period. According to the embodiment, the press-release cycle duration (sum of the press duration t1 and the release duration t0) is preferably determined within the range of a duration for which the loss tangent tan Δ that the dry film material has is 1.0 or less. The reason is that the loss tangent tan Δ is an index representing whether the viscoelasticity properties are attributed to elasticity predominant over viscosity, or vice versa. The fact that tan Δ is 1.0 or less means that press is performed in a region in which elasticity is predominant. In the case of the region in which elasticity is predominant, even when the dry film material is deformed by the pressing force in the press period, the deformation can be elastically restored in a subsequent release period. That is, since the release period is repeated, the elastic restoration of the deformation enables the flow deformation of the dry film material itself to be suppressed, and this facilitates stable formation of the shape. The repetition of the press-release cycle increases the press duration cumulatively at a portion of the substrate in contact with the dry film material and thereby improves adhesion. From the above reasons, it is very useful to determine the press duration and the release duration in accordance with the viscoelasticity properties of the dry film material because the adhesion and the stability of the shape can be ensured.

For example, in the case of using the positive resist (trade name is ODUR-1010A made by TOKYO OHKA KOGYO CO., LTD.), as illustrated in FIG. 4A, the press-release cycle duration (t) may be determined to be 5.0 milliseconds or less (10 raised to the power of −2.3) or 2.4 seconds or more (10 raised to the power of 0.38). In the case where the press-release cycle duration is within the above range, the loss tangent tan Δ is 1.0 or less. The pressing force may be appropriately adjusted by using shear moduli (the shear storage modulus and the shear loss modulus) in a predetermined press-release cycle duration. In the press-release cycle, flow deformation occurs somewhat, and an excessive pressing force causes deformation of the space to be formed. Accordingly, the value of the pressing force needs to be determined such that the shape of the space to be formed is acceptable but does not particularly limit the present disclosure.

Figure 4B:
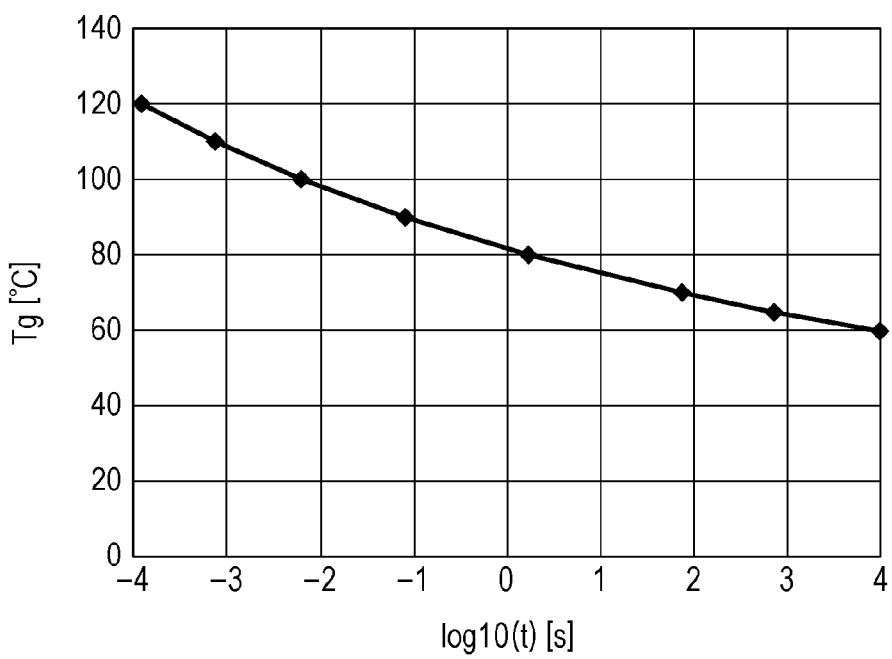

It has been known that many polymeric materials have a peak value of tan Δ. In some cases, the peak value is defined as Tg (glass-transition temperature). The glass-transition temperature means a temperature at which, when an amorphous solid is heated, the stiffness and viscosity of the solid, which is as hard as crystal and is not fluid at a low temperature, rapidly decrease and the fluidity increases. FIG. 4B illustrates the relationship between the glass-transition temperature of the above positive resist and the press-release cycle duration. This is a graph obtained by using a WLF equation, which is a temperature-time conversion law, from the master curve at the reference temperature. It can be seen from FIG. 4B that Tg varies depending on the press-release cycle duration (t). According to the present disclosure, the process temperature when the dry film is tented is preferably equal to or more than the glass-transition temperature of the dry film material. The process temperature when the dry film is tented means a temperature in the process of performing the press-release cycle a plurality of times. That is, from the viewpoint that the adhesion between the dry film material 4 and the substrate 1 is ensured, it is very effective for the process temperature in the press period and the release period to be determined to be equal to or more than Tg illustrated in FIG. 4B in a predetermined press-release cycle duration. In the case where the process temperature is Tg or more, the stiffness and fluidity of the dry film material are improved, and a sufficient adhesion between the dry film material and the substrate can be ensured. Some materials do not have a definite peak value of tan Δ, and in these cases, Tg cannot be defined. Such materials are out of range of the description of this paragraph. The temperature may be appropriately determined so as to ensure appropriate stiffness and fluidity to perform the press-release cycle.

The following description includes an example of using the positive resist (trade name is ODUR-1010A made by TOKYO OHKA KOGYO CO., LTD.). In the case where the press-release cycle duration (t) is determined to be, for example, 10 seconds (10 raised to the power of 1), as illustrated in FIG. 4B, the process temperature is preferably determined to be 75° C. or more, which is equal to or more than Tg of the dry film material. As described above, since the viscoelasticity properties of the dry film material change depending on the temperature, it is preferable that whether the press-release cycle duration is within the range of a duration for which tan Δ is 1.0 or less be considered to determine the process temperature.

Figure 5:
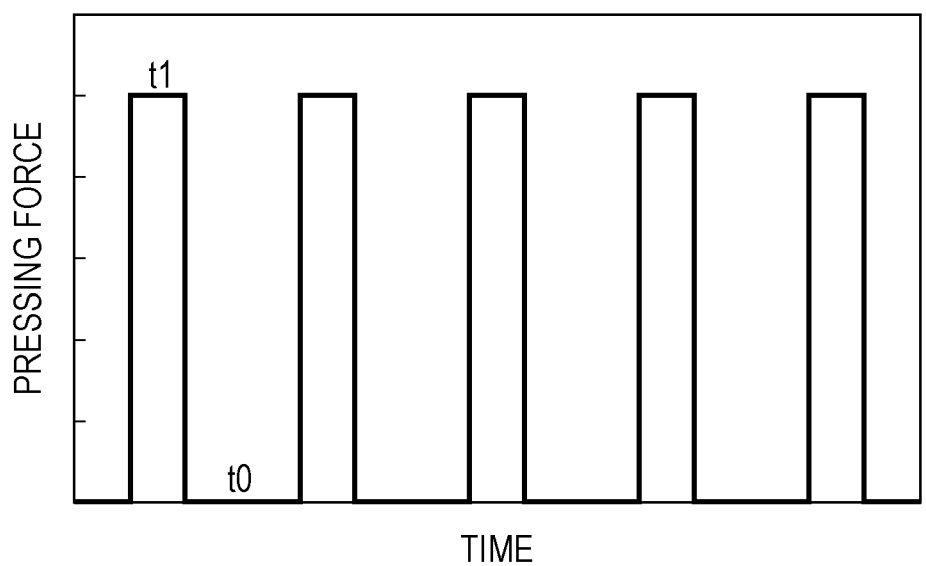
FIG. 5 is a graph illustrating the relationship between the pressing force and time according to an embodiment of the present disclosure.

As illustrated in FIG. 5, in the case where the release period (release duration t0) is determined to be longer than the press period (press duration t1), sufficient time required to restore the elastic component of the dry film material 4 can be ensured. Consequently, deformation of the dry film material 4 is suppressed, and the space is easy to form stably.

Figure 6:
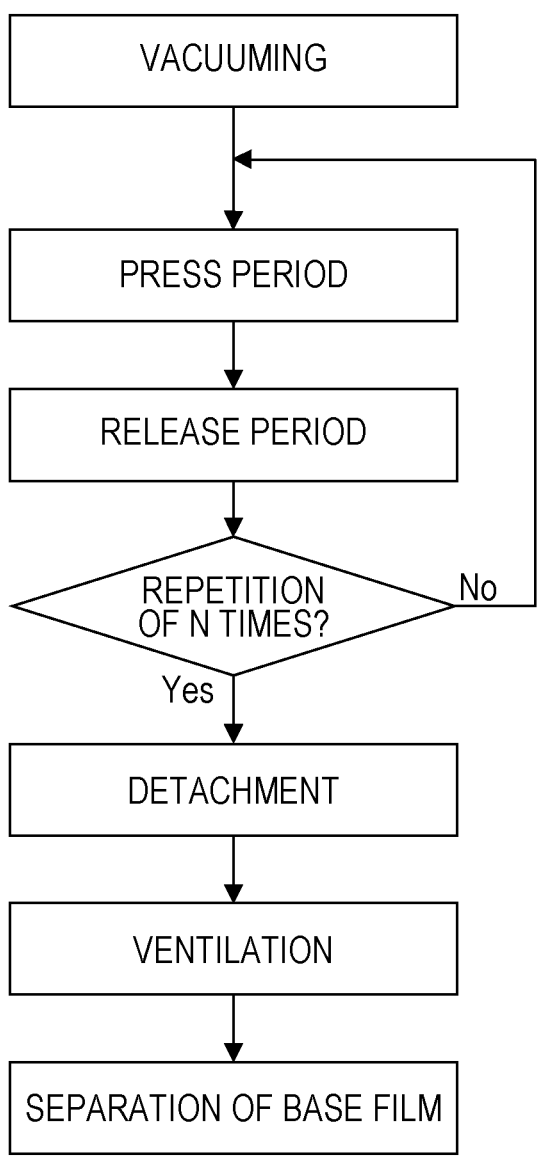
FIG. 6 is a process flow chart according to an embodiment of the present disclosure.

As illustrated in FIG. 6, the method of forming a space according to the present disclosure may include a process flow in which the press period is started in a vacuum state, the press-release cycle is performed in the vacuum state a plurality of times, and ventilation is subsequently started. That is, the process flow that can be used is as follows. The substrate 1 and the dry film 5 are first placed in the pressing apparatus (see FIG. 2A), vacuuming is subsequently performed on the whole, and press is performed in the vacuum state. After all of the repetitions of the press-release cycle are finished, and the pressing member 6 is detached, ventilation is started. This process flow can prevent a gap such as a bubble from remaining between the dry film material 4 and the substrate 1 and is very useful from the viewpoint of an improvement in the adhesion. In addition, vacuuming and ventilation processes need to be performed only once, and the process flow is very useful also from the viewpoint of cycle time.

Figure 7:
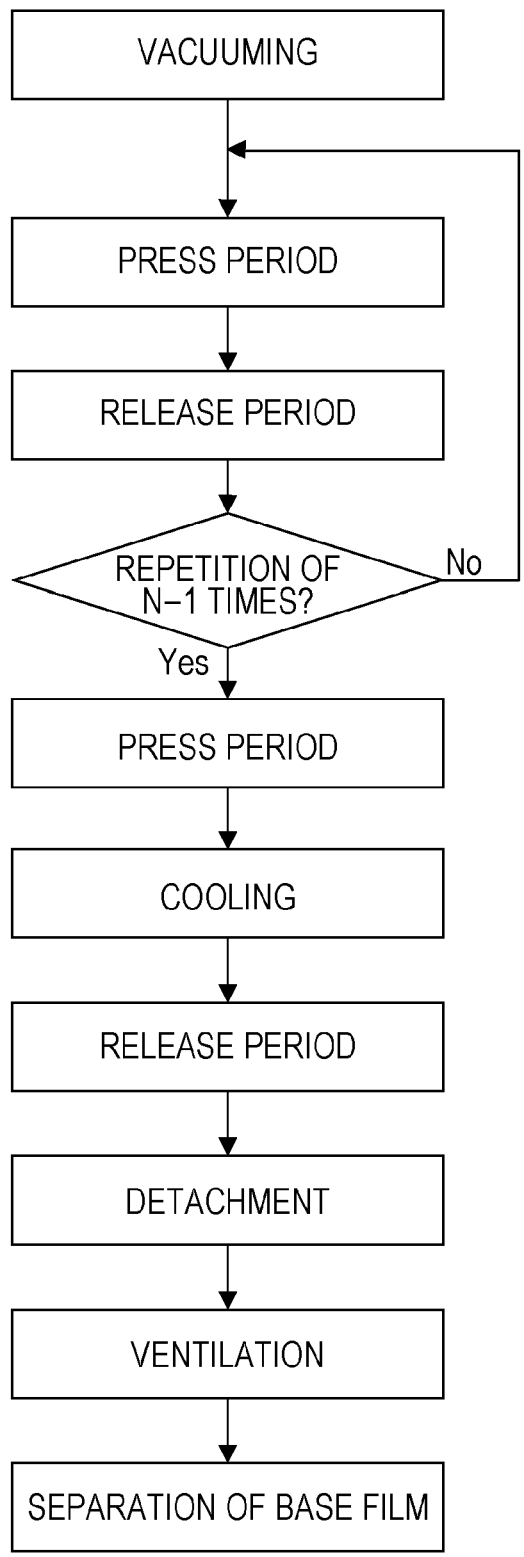
FIG. 7 is a process flow chart according to an embodiment of the present disclosure.

As illustrated in FIG. 7, in the final cycle (N-th cycle) of the press-release cycle, a cooling process can be performed before the release period while the pressed state in the press period is maintained. The term "cooling" described herein means that the temperature of the process is decreased to be equal to or less than the above glass-transition temperature of the dry film material. The following description includes an example of using the positive resist (trade name is ODUR-1010A made by TOKYO OHKA KOGYO CO., LTD.). In the case where the press-release cycle duration is 10 seconds (10 raised to the power of 1), and the process temperature is 90° C., the temperature in the cooling process can be, for example, 75° C. or less, preferably 15 to 35° C. (close to room temperature). In the cooling process, the process temperature may be actively decreased by using a cooling apparatus, or may be decreased, for example, in a natural cooling manner in which heating is stopped until the temperature becomes room temperature. These may be appropriately selected depending on the material to be used. The cooling process suppresses deformation of the dry film due to an unintentional stress applied to the dry film material or the substrate in the detachment process or the ventilation process after the press-release cycle is finished. This facilitates stable formation of the space.

In the examples described according to the embodiment, the positive resist (trade name is ODUR-1010A made by TOKYO OHKA KOGYO CO., LTD.) is used as the dry film material. The dry film material, however, is not limited to the positive resist. An appropriate dry film material is selected in accordance with the use, and the press duration, the pressing force, and the process temperature in the press-release cycle are determined in consideration of Tg and the loss tangent tan Δ of the dry film material. This achieves the effects of the present disclosure.

First Embodiment

An example of a method of manufacturing a liquid-discharging head will be described with a method of forming a space according to the present disclosure. FIGS. 8A to 8E are schematic sectional diagrams of a process flow according to a first embodiment.

Figure 8A:
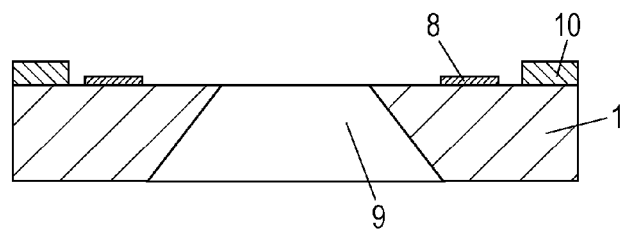
FIGS. 8A to 8E are schematic sectional diagrams of a process flow according to an embodiment of the present disclosure.

The method begins with preparation of a substrate 1 including discharge-energy-generating elements 8, a supply port 9, and an adhesion layer 10 that are formed at predetermined positions (see FIG. 8A). The adhesion layer 10 is a layer for ensuring the adhesion between a wall member 12 formed later and the substrate 1.

Subsequently, a dry film 5 including a positive resist as the dry film material 4 formed with a desired film thickness on the base film 3 is prepared. The dry film 5 is tented on a step between the substrate 1 and the adhesion layer 10 by using the pressing member 6 (see FIG. 8B). The press conditions and temperature conditions in the press-release cycle are determined according to the embodiment described above.

Subsequently, the pressing member 6 is detached from the dry film. 5, and the base film 3 is separated from the dry film material 4. Subsequently, the dry film material 4 is patterned through a typical photolithography process, and a channel-forming mold member 11, which is to be a mold for a liquid channel, is manufactured (see FIG. 8C).

Subsequently, a negative resist is formed on the substrate 1, and the wall member 12 and liquid discharge ports 13 are formed through a photolithography process (see FIG. 8D). The wall member 12 forms the wall and ceiling of a liquid channel 14 that are formed later.

Subsequently, UV, which has a photosensitive wavelength of the channel-forming mold member 11, is emitted over the wall member 12 to make the channel-forming mold member 11 soluble in an organic solvent. Subsequently, the channel-forming mold member 11 is removed by being immersed in the organic solvent. Thus, the liquid channel 14 in communication with the supply port 9 and the liquid discharge ports 13 is formed.

Figure 8B:
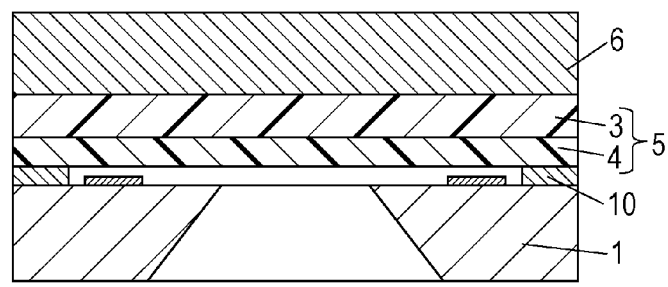
Figure 8C:
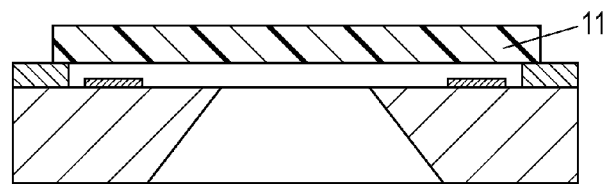
Figure 8D:
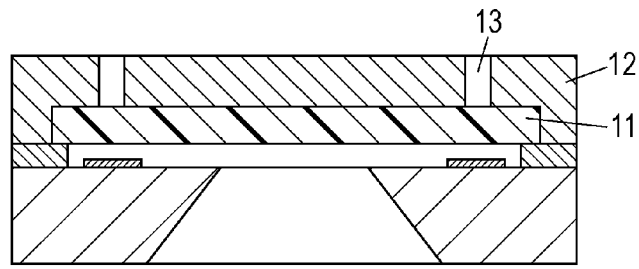

According to the first embodiment, the processes illustrated in FIGS. 8B to 8C thus improve the adhesion between the dry film material 4, which is to be the channel-forming mold member 11, and the adhesion layer 10. Consequently, when the base film 3 is separated from the substrate 1, a process failure such as the separation of the dry film material 4 itself from the substrate 1 or the cohesive failure is suppressed, and the yield is improved, which are beneficial. The adhesion layer 10 having the limited thickness makes a space between the first surface of the substrate 1 and the channel-forming mold member 11, the height of the formed space can be stable, and accordingly, the height of the liquid channel 14 to be formed can be stable (see FIG. 8E). Consequently, a liquid-discharging head having a space stably formed with high precision can be manufactured in good yield, which is beneficial.

Second Embodiment

Figure 9A:
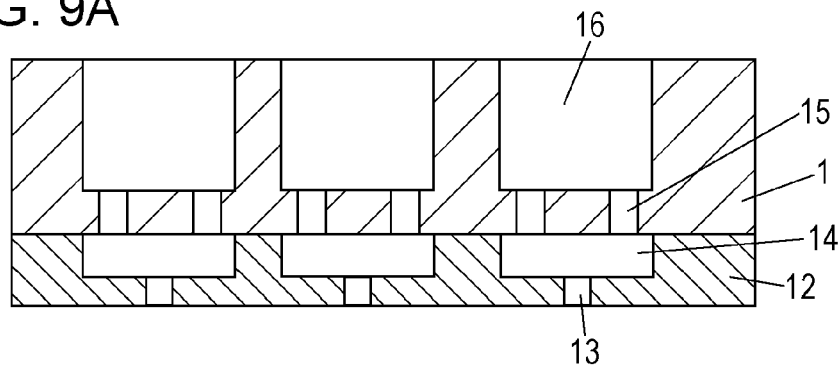
FIGS. 9A to 9C are schematic sectional diagrams of a process flow according to an embodiment of the present disclosure.
Figure 9B:
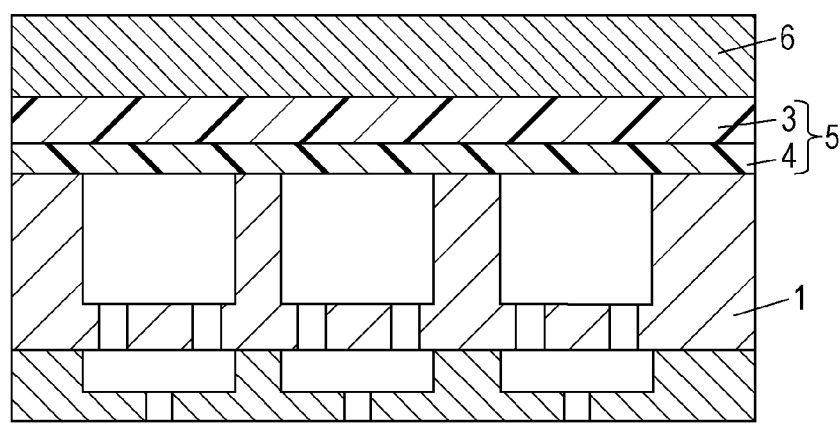
Figure 9C:
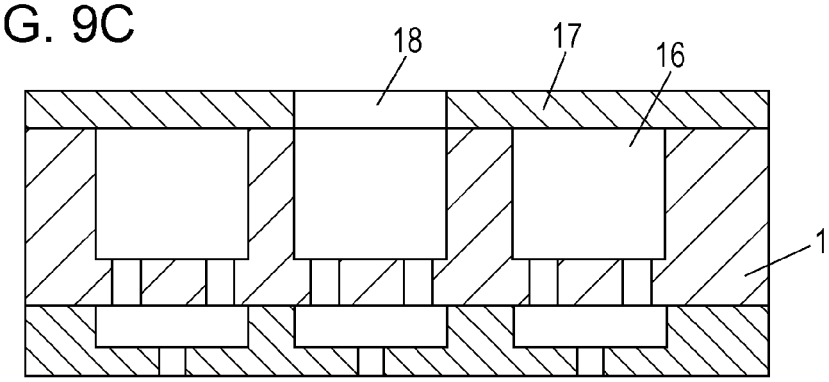

Another example of a method of manufacturing a liquid-discharging head will be described with a method of forming a space according to the present disclosure. FIGS. 9A to 9C are schematic sectional diagrams of a process flow according to a second embodiment.

The method begins with preparation of a substrate 1 in which a wall member 12 is formed on the first surface (see FIG. 9A). The substrate 1 has common liquid chambers 16, independent supply ports 15 in communication with the corresponding common liquid chambers, and discharge-energy-generating elements (not illustrated) on the first surface. The wall member 12 has liquid discharge ports 13 and liquid channels 14 in communication with the respective liquid discharge ports.

Subsequently, a dry film 5 including a negative resist as the dry film material 4 formed with a desired film thickness on the base film 3 is prepared. The dry film 5 is tented on the substrate 1 by using the pressing member 6 (see FIG. 9B). The press conditions and temperature conditions in the press-release cycle are determined according to the embodiment described above.

Subsequently, the pressing member 6 is detached from the dry film 5, and the base film 3 is separated from the dry film material 4. Subsequently, the negative resist is cured in a typical photolithography process to form a channel member 17 (see FIG. 9C). The channel member 17 serves as the top plate on the common liquid chambers so as to define some of the common liquid chambers 16 as closed spaces, and has, at a predetermined position, an opening 18 through which a liquid flows.

According to the second embodiment, the adhesion between the channel member 17 and the substrate 1 is improved, and a failure such as a leak of a liquid between the adjoining common liquid chambers 16 is suppressed. In addition, deformation and depression of the channel member 17 in the form of the top plate are suppressed. This enables the section of the common liquid chambers 16 in communication with the corresponding liquid channels 14 to be stable. Consequently, a liquid-discharging head having spaces stably formed with high precision can be manufactured in good yield, which is beneficial.

Example

A liquid-discharging head was manufactured by the following processes.

Heat elements as the discharge-energy-generating elements 8 were first formed on a silicon substrate as the substrate 1. A film of polyetheramide and an N-methylpyrrolidone solvent was formed on the substrate by spin coating so as to have a thickness of 2 μm. A positive resist was formed on the substrate and patterned by using a photolithography technique. The polyetheramide was removed by dry etching, and the positive resist was separated to form the adhesion layer 10. Subsequently, the supply port 9 was formed by anisotropic etching with TMAH (tetramethylammonium hydroxide) to prepare the substrate 1 (see FIG. 8A).

Figure 8E:
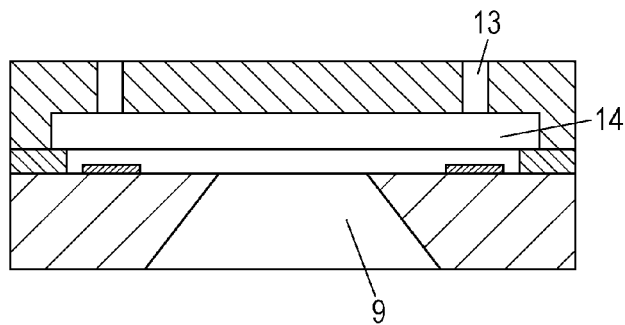
Figure 10:
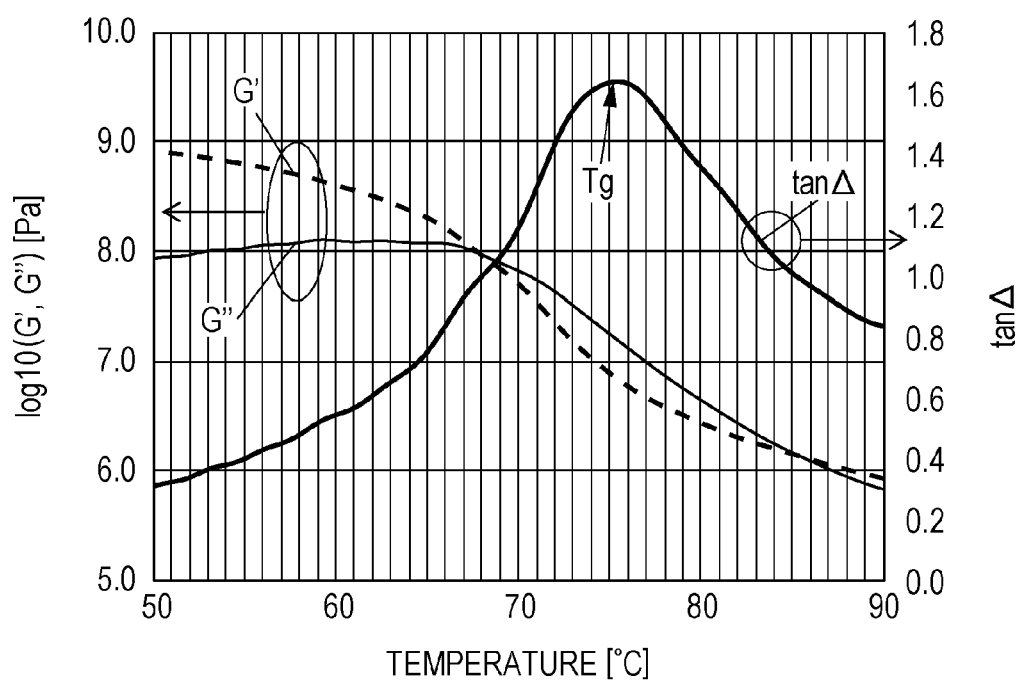
FIG. 10 is a graph illustrating an embodiment of the present disclosure.

Subsequently, the dry film 5 was prepared. The base film 3 of the dry film 5 was made of polyimide, and the dry film material 4 thereof was the positive resist ODUR-1010A (trade name) made by TOKYO OHKA KOGYO CO., LTD. The film thickness of the dry film 5 was determined to be 12 µm. Subsequently, the substrate 1 and the dry film 5 were placed so as not to be in contact with each other in a vacuum chamber, as the pressing member 6, including a pressing mechanism having a flat shape. After vacuuming was performed until the pressure became 100 Pa, 6 cycles of the press period and the release period were repeatedly performed by using the pressing mechanism with the temperature set to 90° C. In the press period, the pressing force F1 was 0.5 MPa and the press duration t1 was 5 seconds. In the release period, the pressing force F0 was 0.003 MPa and the release duration t0 was 5 seconds. That is, the press-release cycle duration (t) in the example was 10 seconds. As illustrated in FIG. 4A, when t=10, tan Δ of the dry film material is 1.0 or less. FIG. 10 is a graph illustrating Tg in these conditions. The graph in FIG. 10 is obtained by re-illustrating the graph in FIG. 4A such that the temperature is plotted on the horizontal axis by using the temperature-time conversion law. The temperature at which tan Δ peaks, that is, Tg of the dry film material is about 75° C. The process temperature (90° C.) of the press-release cycle was determined to be equal to or more than Tg. Subsequently, the substrate was cooled to 30° C. while the pressed state in the press period of the 7-th cycle was maintained, the release period was subsequently performed, the pressing member 6 was detached, and the ventilation of the vacuum chamber was started. Subsequently, the base film 3 was separated, and the dry film material 4 was subsequently patterned by a typical photolithography process to form the channel-forming mold member 11 corresponding to the mold for the liquid channel (see FIG. 8C). Subsequently, a photosensitive epoxy resin, which was to be the wall member, was applied, patterning was performed by exposure and development to form the liquid discharge ports 13 and the wall member 12 (see FIG. 8D). After deep UV was emitted from above to make the channel-forming mold member 11 soluble in a removing solution (ethylcellosolve), the channel-forming mold member 11 was removed to form the liquid channel 14 (FIG. 8E).

The obtained liquid-discharging head had no failure, such as separation or rise of the pattern of the mold member, and the height of the liquid channel 14 was uniform. Thus, a liquid-discharging head having a space stably formed with high precision was manufactured in good yield.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2016-153041 filed Aug. 3, 2016, which is hereby incorporated by reference herein in its entirety.

What is claimed is:

1. A method of forming a space, comprising:
a step of tenting, on a substrate having a recessed portion, a dry film including a dry film material that is to be a top plate on the recessed portion,
wherein the step of tenting the dry film includes a press period and a release period and performs a press-release cycle of the press period and the release period a plurality of times, a pressed state in which the dry film is pressed against the substrate by using a pressing member is maintained during the press period, and a released state in which the pressed state is released is maintained during the release period,
wherein the step of tenting the dry film includes starting the press period in a vacuum state, performing the press-release cycle in the vacuum state a plurality of times, and subsequently starting ventilation,
wherein the step of tenting the dry film includes cooling a process temperature to a temperature equal to or less than a glass-transition temperature of the dry film material while maintaining the pressed state during the press period of a final cycle of the press-release cycle performed a plurality of times, and subsequently starting the ventilation.

2. The method of forming a space according to claim 1, wherein the pressing member has a flat shape.

3. The method of forming a space according to claim 1, wherein a duration of the press-release cycle is within a range of a duration for which a loss tangent that the dry film material has is 1.0 or less.

4. The method of forming a space according to claim 1, wherein a process temperature in the step of tenting the dry film is equal to or more than a glass-transition temperature of the dry film material.

5. The method of forming a space according to claim 1, wherein the release period is longer than the press period in the step of tenting the dry film.

6. The method of forming a space according to claim 1, wherein the space is to be a liquid channel of a liquid-discharging head.

7. The method of forming a space according to claim 6,
wherein the dry film material is to be a mold for the liquid channel, and
wherein the step of tenting the dry film includes forming, on at least a part of the substrate, an adhesion layer that ensures adhesion between the substrate and a wall member to form a wall and a ceiling of the liquid channel, and subsequently tenting the dry film on a step between the substrate and the adhesion layer.

8. The method of forming a space according to claim 6,
wherein the dry film material is a negative resist material, and
wherein the step of tenting the dry film includes tenting the dry film on the substrate having a liquid discharge port, a liquid channel in communication with the liquid discharge port, a supply port in communication with the liquid channel, and a common liquid chamber.

* * * * *